(12) United States Patent
Casagrande et al.

(10) Patent No.: US 6,972,430 B2
(45) Date of Patent: Dec. 6, 2005

(54) SUBLITHOGRAPHIC CONTACT STRUCTURE, PHASE CHANGE MEMORY CELL WITH OPTIMIZED HEATER SHAPE, AND MANUFACTURING METHOD THEREOF

(75) Inventors: Giulio Casagrande, Vignate (IT); Roberto Bez, Milan (IT); Fabio Pellizzer, Follina (IT)

(73) Assignees: STMicroelectronics S.r.l., Agrate Brianza (IT); OVONYX Inc., Boise, ID (US)

(*) Notice: Subject to any disclaimer, the term of this patent is extended or adjusted under 35 U.S.C. 154(b) by 27 days.

(21) Appl. No.: 10/371,154

(22) Filed: Feb. 20, 2003

(65) Prior Publication Data

US 2004/0012009 A1 Jan. 22, 2004

Related U.S. Application Data

(63) Continuation-in-part of application No. 10/313,991, filed on Dec. 5, 2002.

(30) Foreign Application Priority Data

Feb. 20, 2002 (EP) .................................. 02425088

(51) Int. Cl.$^7$ .......................................... H01L 45/00
(52) U.S. Cl. .................................. 257/4; 257/2; 257/3
(58) Field of Search .............................. 257/2–5, 296, 257/314–316, E27.004; 365/148

(56) References Cited

U.S. PATENT DOCUMENTS

| | | | |
|---|---|---|---|
| 5,789,277 A | 8/1998 | Zahorik et al. | 438/95 |
| 5,814,527 A | 9/1998 | Wolstenholme et al. | 438/5 |
| 5,952,671 A | 9/1999 | Reinberg et al. | 257/3 |
| 5,970,336 A | 10/1999 | Wolstenholme et al. | 438/238 |
| 6,031,287 A * | 2/2000 | Harshfield | 257/734 |
| 6,238,946 B1 * | 5/2001 | Ziegler | 438/50 |
| 6,512,241 B1 | 1/2003 | Lai | 257/4 |
| 6,613,604 B2 | 9/2003 | Maimon et al. | 438/95 |

(Continued)

FOREIGN PATENT DOCUMENTS

| | | |
|---|---|---|
| WO | WO 00/57498 | 9/2000 |
| WO | WO 02/09206 A1 | 1/2002 |

OTHER PUBLICATIONS

Palun, L. et al., "Fabrication of Single Electron Devices by Hybrid (E-Beam/DUV) Lithography," *Microelectronic Engineering 53*, pp. 167-170, 2000.
U.S. Appl. No. 09/276,273, filed Mar. 25, 1999, Klersy.

*Primary Examiner*—Nathan J. Flynn
*Assistant Examiner*—Johannes Mondt
(74) *Attorney, Agent, or Firm*—Lisa K. Jorgenson; Robert Iannucci; Seed IP Law Group PLLC

(57) ABSTRACT

An electronic semiconductor device has a sublithographic contact area between a first conductive region and a second conductive region. The first conductive region is cup-shaped and has vertical walls which extend, in top plan view, along a closed line of elongated shape. One of the walls of the first conductive region forms a first thin portion and has a first dimension in a first direction. The second conductive region has a second thin portion having a second sublithographic dimension in a second direction transverse to the first dimension. The first and the second conductive regions are in direct electrical contact at their thin portions and form the sublithographic contact area. The elongated shape is chosen between rectangular and oval elongated in the first direction. Thereby, the dimensions of the contact area remain approximately constant even in presence of a small misalignment between the masks defining the conductive regions.

16 Claims, 12 Drawing Sheets

U.S. PATENT DOCUMENTS

| | | |
|---|---|---|
| 6,750,079 B2 | 6/2004 | Lowrey et al. ................ 438/95 |
| 2001/0002046 A1 | 5/2001 | Reinberg et al. ................ 257/3 |
| 2002/0017701 A1 | 2/2002 | Klersy et al. ................ 257/536 |
| 2002/0036931 A1* | 3/2002 | Lowrey et al. ............. 365/200 |
| 2002/0060334 A1* | 5/2002 | Shukuri et al. ............. 257/306 |
| 2002/0070401 A1* | 6/2002 | Takeuchi et al. ............ 257/296 |
| 2003/0075778 A1 | 4/2003 | Klersy ........................ 257/536 |
| 2003/0219924 A1 | 11/2003 | Bez et al. .................... 438/102 |
| 2003/0231530 A1 | 12/2003 | Bez et al. .................... 365/200 |
| 2004/0012009 A1 | 1/2004 | Casagrande et al. ........... 257/4 |

* cited by examiner

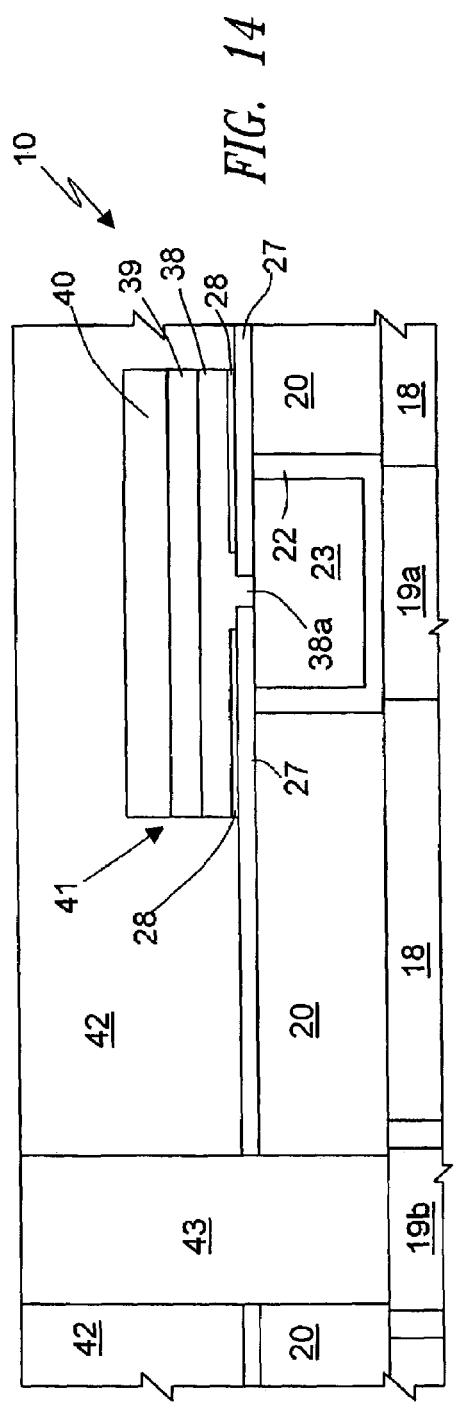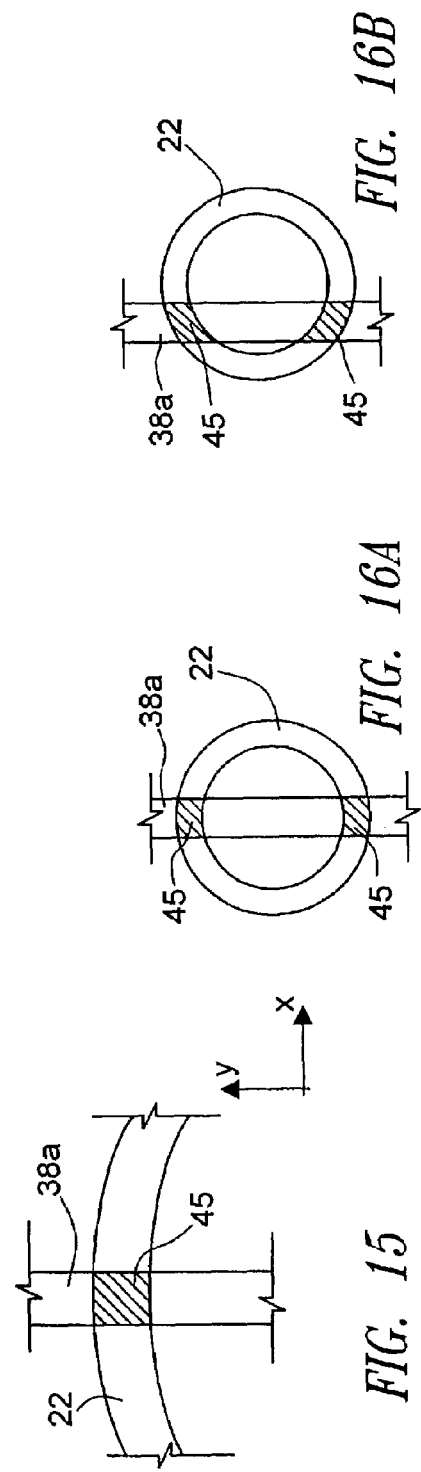

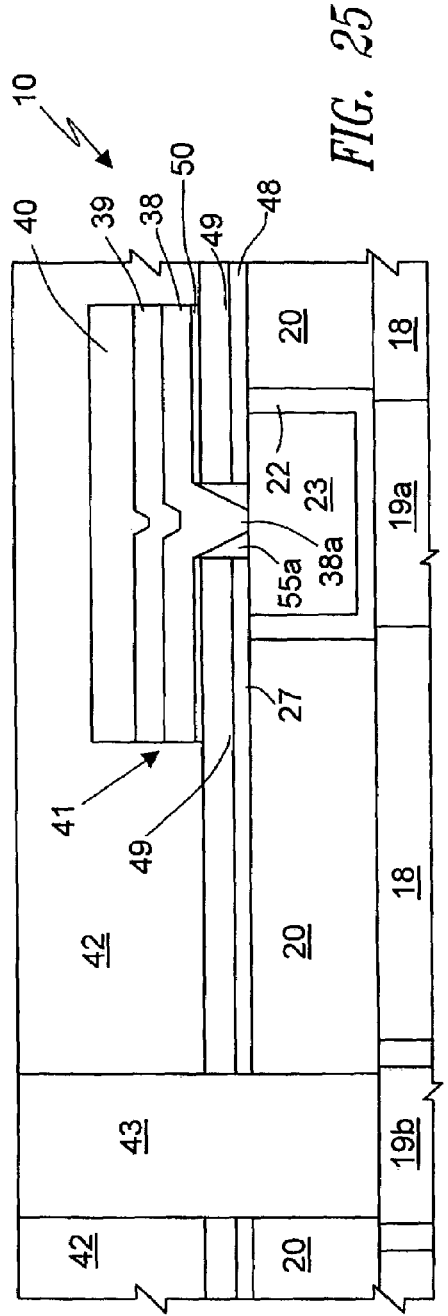
FIG. 25
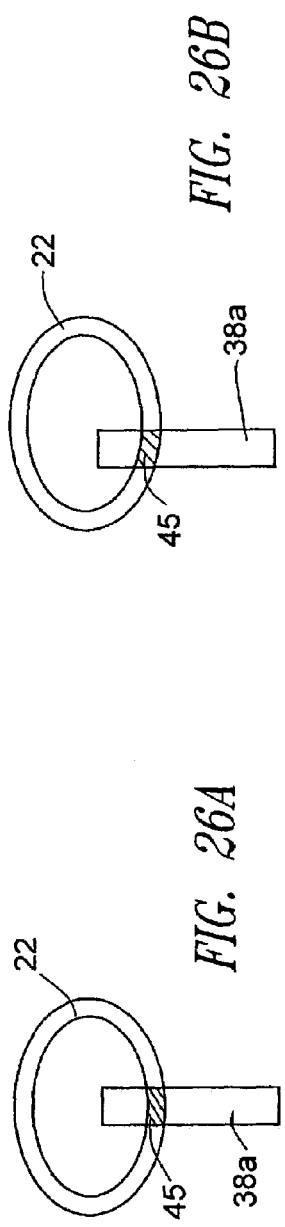
FIG. 26A
FIG. 26B

SUBLITHOGRAPHIC CONTACT STRUCTURE, PHASE CHANGE MEMORY CELL WITH OPTIMIZED HEATER SHAPE, AND MANUFACTURING METHOD THEREOF

CROSS-REFERENCE TO RELATED APPLICATION

This application is a continuation-in-part of U.S. patent application Ser. No. 10/313,991, filed Dec. 5, 2002, now pending, which application is incorporated herein by reference in its entirety.

BACKGROUND OF THE INVENTION

1. Field of the Invention

The present invention relates to a sublithographic contact structure, a phase change memory cell, and to a manufacturing process thereof.

2. Description of the Related Art

As is known, phase change memory (PCM) elements exploit the characteristics of materials which have the property of changing between two phases having distinct electrical characteristics. For example, these materials may change from an amorphous phase, which is disorderly, to a crystalline or polycrystalline phase, which is orderly, and the two phases are associated to considerably different resistivity.

At present, alloys of group VI of the periodic table, such as Te or Se, referred to as chalcogenides or chalcogenic materials, can advantageously be used in phase change cells. The chalcogenide that currently offers the most promise is formed by a Ge, Sb and Te alloy ($Ge_2Sb_2Te_5$), which is currently widely used for storing information in overwritable disks.

In chalcogenides, the resistivity varies by two or more magnitude orders when the material passes from the amorphous phase (more resistive) to the polycrystalline phase (more conductive) and vice versa. The characteristics of chalcogenides in the two phases are shown in FIG. 1. As may be noted, at a given read voltage, here designated by Vr, there is a resistance variation of more than 10.

Phase change may be obtained by locally increasing the temperature, as shown in FIG. 2. Below 150° C. both phases are stable. Above 200° C. (temperature of start of nucleation, designated by $T_x$), fast nucleation of the crystallites takes place, and, if the material is kept at the crystallization temperature for a sufficient length of time (time $t_2$), it changes its phase and becomes crystalline. To bring the chalcogenide back into the amorphous state, it is necessary to raise the temperature above the melting temperature $T_m$ (approximately 600° C.) and then to cool the chalcogenide off rapidly (time $t_1$).

From the electrical standpoint, it is possible to reach both critical temperatures, namely the crystallization temperature and the melting point, by causing a current to flow through a resistive element which heats the chalcogenic material by the Joule effect.

The basic structure of a PCM element 1 which operates according to the principles described above is shown in FIG. 3 and comprises a resistive element 2 (heater) and a programmable element 3. The programmable element 3 is made of a chalcogenide and is normally in the polycrystalline state in order to enable a good flow of current. One part of the programmable element 3 is in direct contact with the resistive element 2 and forms the area affected by phase change, hereinafter referred to as the phase change portion 4.

If an electric current having an appropriate value is caused to pass through the resistive element 2, it is possible to heat the phase change portion 4 selectively up to the crystallization temperature or to the melting temperature and to cause phase change. In particular, if a current I flows through a resistive element 2 having resistance R, the heat generated is equal to $I^2R$.

The use of the PCM element of FIG. 3 for forming memory cells has already been proposed. In order to prevent noise caused by adjacent memory cells, the PCM element is generally associated to a selection element, such a MOS transistor, a bipolar transistor, or a diode.

All the known approaches are, however, disadvantageous due to the difficulty in finding solutions that meet present requirements as regards capacity for withstanding the operating currents and voltages, as well as functionality and compatibility with present CMOS technologies.

In particular, considerations of a technological and electrical nature impose the creation of a contact area of small dimensions, preferably 20 nm×20 nm, between the chalcogenic region and a resistive element. However, these dimensions are much smaller than those that can be obtained with current optical (UV) lithographic techniques, which scarcely reach 100 linear nm.

BRIEF SUMMARY OF THE INVENTION

An embodiment of the invention provides a contact structure in a semiconductor electronic device. The contact structure includes a cup-shaped first conductive region having vertical walls that form a first thin portion having a first dimension in a first direction; and a second conductive region having a second thin portion having a second sublithographic dimension in a second direction transverse to the first dimension. The first and second conductive regions are in direct electrical contact at the first and second thin portions and define a contact area having a sublithographic extension. The first conductive region extends, in top plan view, along a closed line having an elongated shape in the first direction.

Another embodiment of the invention provides a phase change memory cell that includes a cup-shaped resistive element comprising vertical walls forming a first sublithographic portion in a first direction; and a memory region of a phase change material including a second thin portion having a second sublithographic dimension in a second direction transverse to the first dimension. The resistive element and the memory region are in direct electrical contact at the first thin portion and the second thin portion and define a contact area having a sublithographic extension, and the resistive element extends, in top plan view, along a closed line having an elongated shape in the first direction.

Other embodiments provide a process for manufacturing a semiconductor electronic device having a contact area as described above and a process for manufacturing a phase change memory cell as described above.

BRIEF DESCRIPTION OF THE SEVERAL VIEWS OF THE DRAWING(S)

For a better understanding of the present invention, a preferred embodiment thereof is now described, purely by way of non-limiting example, with reference to the attached drawings, in which:

FIGS. 7–14 are cross-section of the structure of the parent patent application, in successive manufacture steps;

FIG. 15 is a top plan view, with parts removed and at an enlarged scale, of a detail of FIG. 4;

FIGS. 16A and 16B are top plan views, with parts removed, of a detail of FIG. 14, in two different manufacture conditions;

FIG. 25 is a cross-section, similar to FIG. 14, in a final manufacture step according to an embodiment of the invention;

FIGS. 26A and 26B are top plan views of the contact area, in two different manufacture conditions.

DETAILED DESCRIPTION OF THE INVENTION

The parent application teaches forming the contact area as an intersection of two thin portions extending transversely with respect to one another and each of a sublithographic size. In order to form the thin portions, deposition of layers is adopted instead of a lithographic process, given that deposition makes it possible to obtain very thin layers, i.e., having a thickness much smaller than the current minimum size that can be achieved using lithographic techniques.

For a better understanding of the problem of the present invention, the manufacturing process of the parent patent application will now be described.

Figure 4:
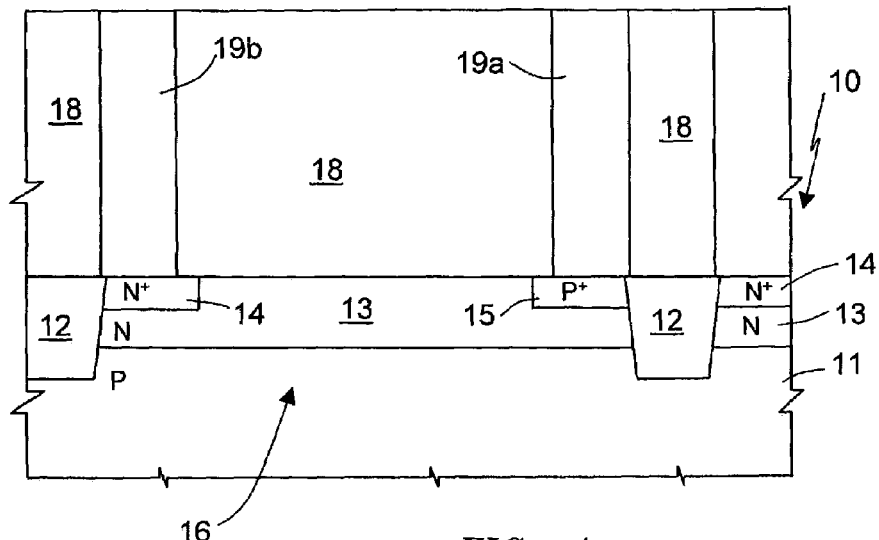
FIG. 4 shows a cross section of a wafer of semiconductor material in a manufacturing step of the cell of FIG. 3, according to the parent patent application.

With reference to FIG. 4, initially a wafer 10 comprising a P-type substrate 11 is subjected to standard front end steps. In particular, inside the substrate 11 insulation regions 12 are formed and delimit active areas 16; then, in succession, N-type base regions 13, $N^+$-type base contact regions 14, and $P^+$-type emitter regions 15 are implanted. The base regions 13, base contact regions 14, and emitter regions 15 form diodes that form selection elements for the memory cells.

Next, a first dielectric layer 18 is deposited and planarized; openings are formed in the first dielectric layer 18 above the base contact regions 13 and emitter regions 15, and the openings are filled with tungsten to form base contacts 19b and emitter contacts 19a. The base contacts 19b are thus in direct electrical contact with the base contact regions 13, and the emitter contacts 19a are in direct electrical contact with the emitter regions 15. Advantageously, the openings in the first dielectric layer 18 can be covered by a barrier layer, for example a Ti/TiN layer, before being filled with tungsten. In this way, the structure of FIG. 4 is obtained.

Figures 5, 6:
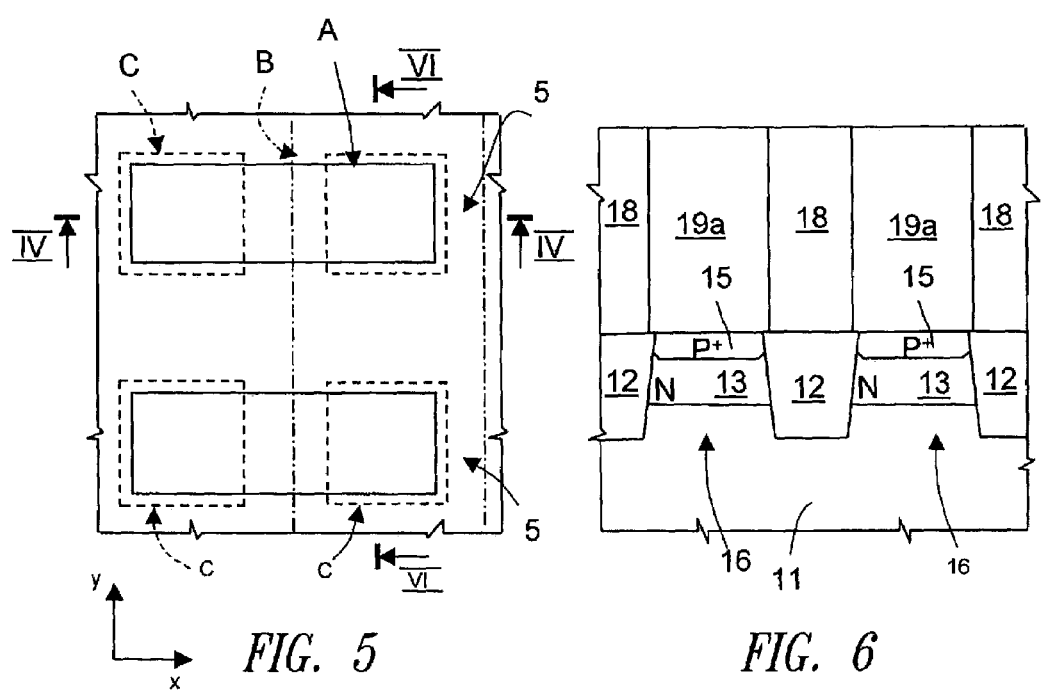
FIG. 5 shows the layout of some masks used for forming the structure of FIG. 4.
FIG. 6 is a cross-section taken along line VI—VI of FIG. 5.

FIG. 5 shows the layout of some masks used for forming the structure of FIG. 4 regarding a pair of memory cells 5 that are adjacent in a perpendicular direction to the sectional plane of FIG. 4 (Y direction). In particular, the figure shows a mask A used for defining the active areas 16, a mask B used for implanting the emitter regions 15, and a mask C for forming the openings where the base contacts 19b and the emitter contacts 19a are to be formed. FIG. 4 is a cross-section taken along line IV—IV of FIG. 5, while FIG. 6 shows the same structure sectioned along the section line VI—VI of FIG. 5.

Figure 1:
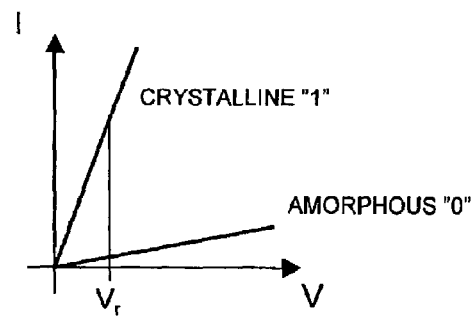
FIG. 1 shows the current versus voltage characteristic of a phase change material.
Figure 2:
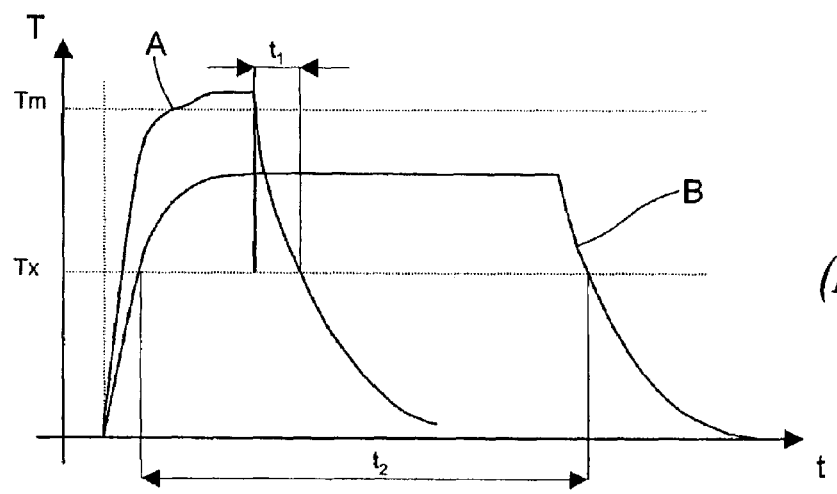
FIG. 2 shows the temperature versus current plot of a phase change material.
Figure 3:
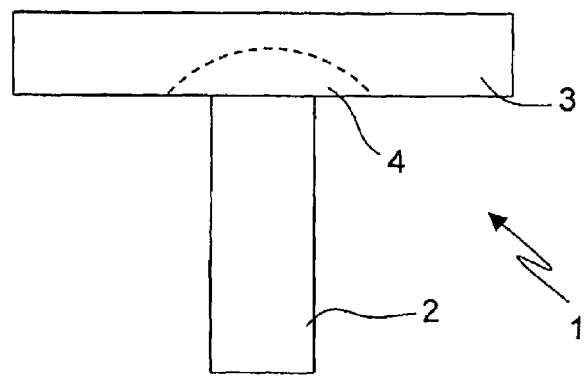
FIG. 3 shows the basic structure of a PCM memory element.

Next (FIG. 7), a second dielectric layer 20—for example, an undoped silicon glass (USG) layer—is deposited, and openings 21 are formed in the second dielectric layer 20 above the emitter contact 19a. The openings 21 have dimensions dictated by the lithographic process and are, for example, circle-shaped. Next, a heating layer, for example of TiSiN, TiAlN or TiSiC, is deposited for a thickness of 10–50 nm, preferably 20 nm. The heating layer, designed to form the resistive element 2 of FIG. 3, conformally coats the walls and bottom of the openings 21 and is subsequently removed outside the openings 21. The remaining portions of the heating layer thus form a cup-shaped region 22 and are then filled with dielectric material 23.

Figure 8:
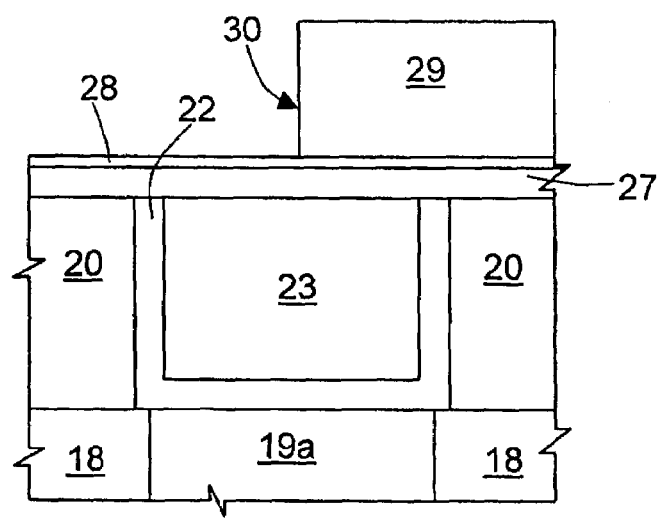

Next, as shown in the enlarged detail of FIG. 8, a mold layer 27, for instance USG having a thickness of 20 nm, an adhesion layer 28, for instance Ti or Si with a thickness of 5 nm, and a first delimiting layer 29, for example nitride or another material that enables selective etching with respect to the mold layer 27, are deposited in sequence. The first delimiting layer 29 has a thickness of, for instance, 150 nm. Then, using a mask, one part of the first delimiting layer 29 is removed by dry etching to form a step which has a vertical side 30 that extends vertically on top of the dielectric material 23. The structure shown in FIG. 8 is thus obtained.

Figure 9:
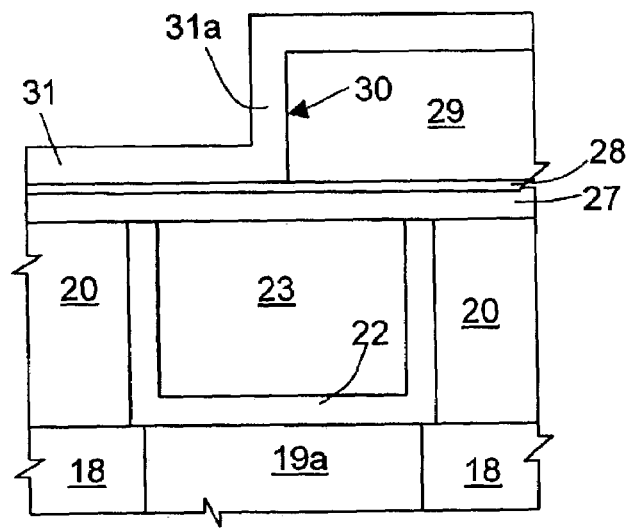

Next (FIG. 9), a sacrificial layer 31, for example TiN with a thickness of 30 nm, is deposited conformally. In particular, the sacrificial layer forms a vertical wall 31a that extends along the vertical side 30 of the first delimiting layer 29.

Figure 10:
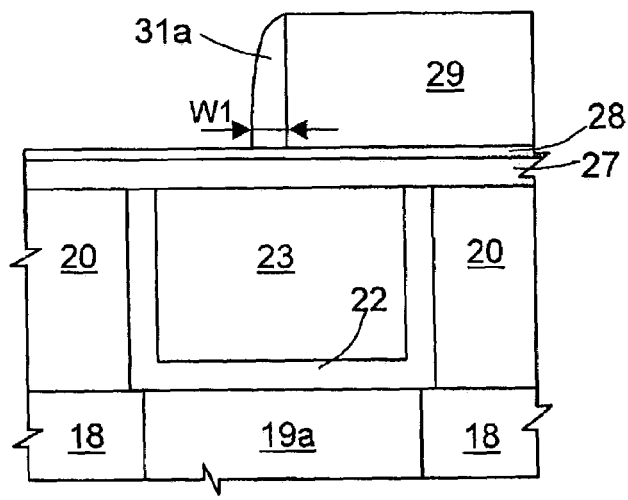

Next (FIG. 10), the sacrificial layer 31 is undergoes an etch back that results in removal of the horizontal portions of the sacrificial layer 31 and of part of the vertical wall 31a. By appropriately choosing the thickness of the first delimiting layer 29 and the thickness of the sacrificial layer 31, as well as the time and type of etching, it is possible to obtain the desired sublithographic width W1 for the bottom part of the remaining vertical wall 31a.

Figure 11:
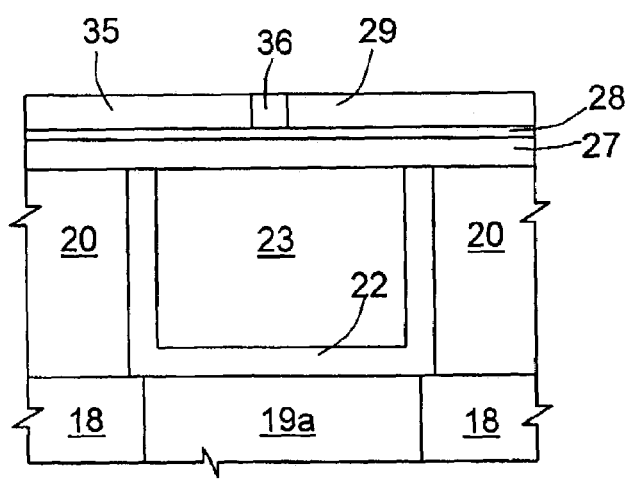

As shown in FIG. 11, a second delimiting layer 35, of the same material as the first delimiting layer 29, for example nitride, with a thickness of 300 nm, is deposited. Next, the delimiting layers 29, 35 and the vertical wall 31a are thinned by chemical mechanical polishing (CMP). At the end, the remaining portions of the delimiting layers 29, 35 form a hard mask, and the remaining portion of the vertical wall forms a sacrificial region 36.

Figure 12:
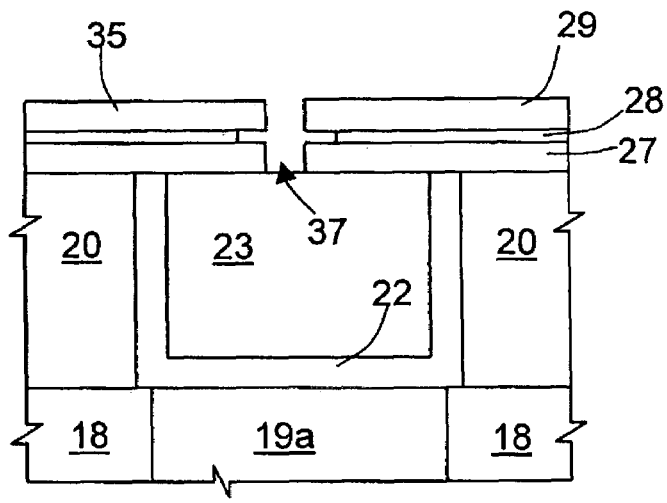

Next (FIG. 12), the sacrificial region 36 is removed. The adhesion layer 28 is isotropically etched, and the mold layer 27 is dry etched to form a slit 37 in the mold layer 27, the slit 37 having a width W1 equal to the width of the sacrificial region 36.

Figure 13:
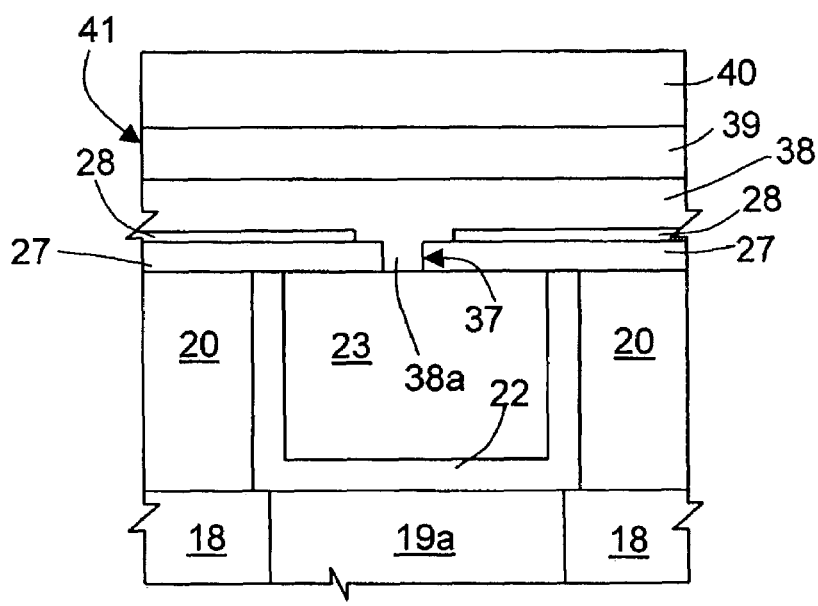

Next (FIG. 13), the delimiting layers 29, 35 are removed, and a chalcogenic layer 38, for example of $Ge_2Sb_2Te_5$ with a thickness of 60 nm, is deposited conformally. The portion 38a of the chalcogenic layer 38 fills the slit 37 and forms, at the intersection with the cup-shaped region 22, a phase change region similar to the phase change portion 4 of FIG. 3. Then, on top of the chalcogenic layer 38 a barrier layer 39, for example of Ti/TiN, and a metal layer 40, for example of AlCu, are deposited. The structure of FIG. 13 is thus obtained.

Next (FIG. 14), the stack formed by the metal layer 40, the barrier layer 39 and the chalcogenic layer 38 is defined using a same mask, thus forming a bit line 41. Finally, a third dielectric layer 42 is deposited, which is opened above the base contacts 19b. The openings thus formed are filled with tungsten to form top contacts 43 in order to prolong upwards the base contacts 19b. Then standard steps are performed for forming the connection lines for connection to the base contacts 19b and to the bits lines 41, and the final structure of FIG. 14 is thus obtained.

In practice, as shown in FIG. 15, the intersection between the cup-shaped region 22 and the thin portion 38a of the chalcogenic layer 38 forms a contact area 45 which is approximately square and has sublithographic dimensions. This is due to the fact that both the cup-shaped region 22 and the thin portion 38a have a width equal to the thickness of a deposited layer. In fact, the width of the cup-shaped region 22 is given by the thickness of the heating layer, and the width of the thin portions 38a is determined by the thickness of the sacrificial layer 31 along the vertical side 30. In greater detail, in the proximity of the contact area 45, the cup-shaped region 22 has a sublithographic dimension in a first direction (Y direction), and the thin portion 38a has a sublithographic dimension (width W1 of FIG. 10) in a second direction (X direction) which is transverse to the first direction. Hereinafter, the term "sublithographic dimension" means a linear dimension smaller than the limit dimension achievable with current optical (UV) lithographic techniques, and hence smaller than 100 nm, preferably 50–60 nm, down to approximately 20 nm.

In the process described above, forming the thin portion 38a of the chalcogenic layer 38 entails numerous steps and is somewhat complex. Consequently, it is desirable to avail a simpler alternative process.

In addition, the dimensions of the contact area 45 depend upon the alignment tolerances between the mask used for forming the openings 21 and the mask used for removing part of the first delimiting layer 29 and for forming the vertical side 30 (FIG. 8). In fact, as emerges clearly from a comparison between FIGS. 16a and 16b which are top plan views of the contact area 45, in the case of a cup-like region 22 having a circular shape and a diameter of approximately 0.2 μm, an alignment error of even only 0.05 μm between the two masks results in the thin portions 38a no longer crossing the cup-shaped regions 22 perpendicularly, with a consequent considerable increase in the dimensions of the contact area 45 (see FIG. 16b) and hence a considerable increase in the flowing current, the value whereof would be uncontrollable.

Furthermore, the thin portion 38a crosses each cup-shaped region 22 in two points, thus doubling the total contact area between the thin portions 38a and the cup-shaped regions 22, and consequently also increasing the programming current. In the case of a marked misalignment between the two above masks, just one contact area is even obtained which has dimensions far greater than the requirements. The presence of a double contact gives rise to functional problems, given that in this situation it would be impossible to know which of the two contact areas 45 first causes switching of the overlying thin portion 38a (i.e., the phase change portion), nor would it be possible to be certain that both of the thin portions 38a overlying the two contact areas will switch.

In the following description, parts that are the same as those previously described with reference to FIGS. 4–14 are designated by the same reference numbers.

Figure 7:
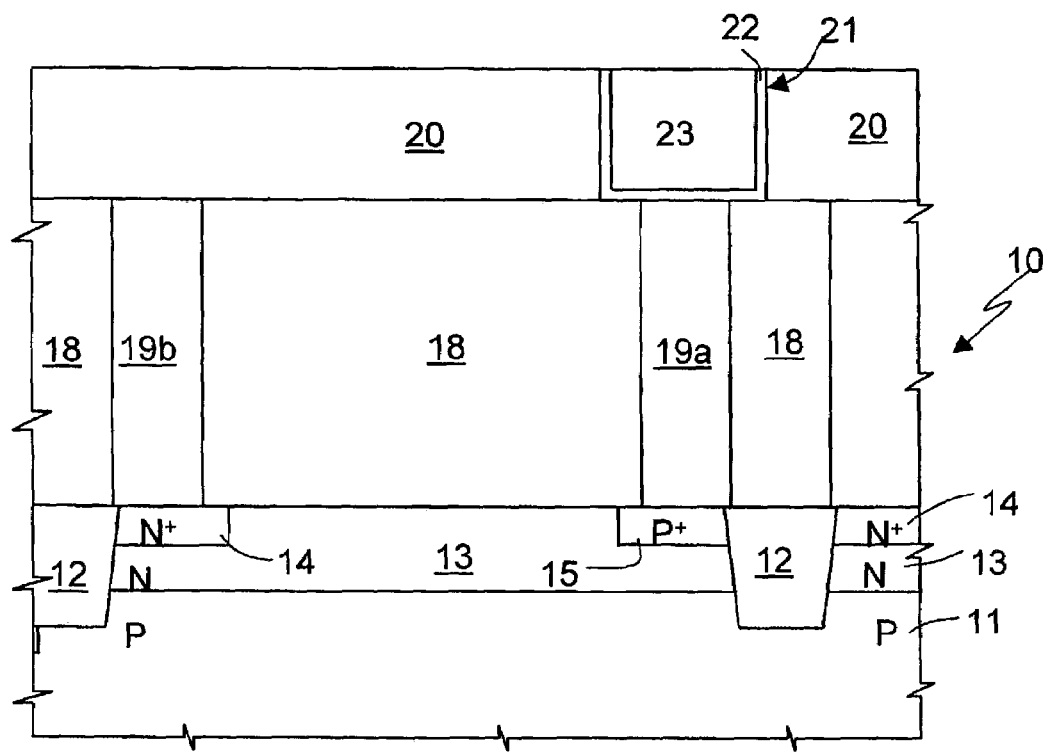
Figure 17:
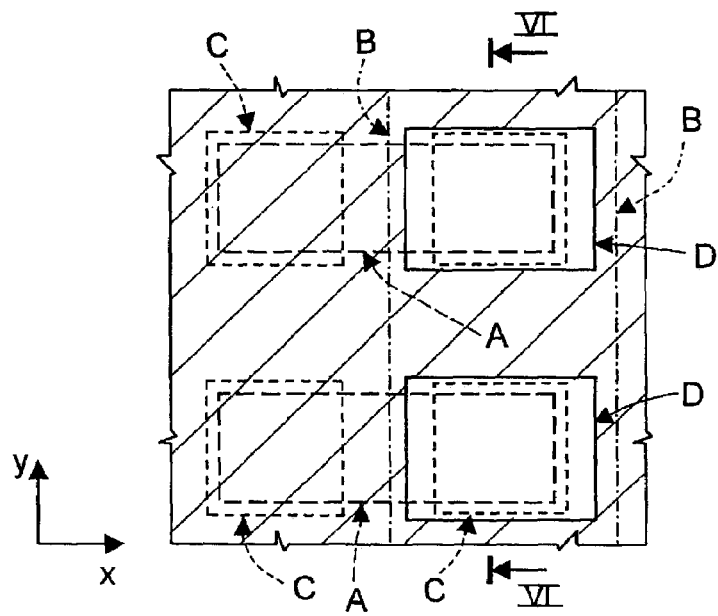
FIG. 17 shows the layout of some masks used for forming the structure of FIG. 7, according to an embodiment of the invention.
Figure 22:
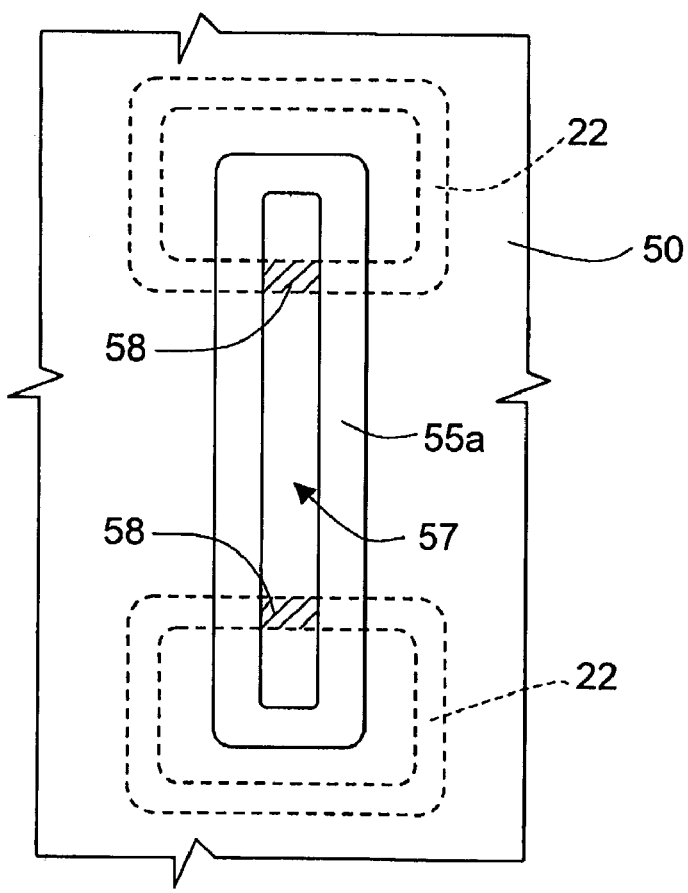
FIG. 22 is a top plan view of the structure of FIG. 21.

The process according to an embodiment of the present invention comprises initial steps equal to those described above, up to deposition of the second dielectric layer 20 (FIG. 7). Next, also here the openings 21 and the cup-shaped regions 22 are formed. However, as shown in FIG. 17, for the definition of the openings 21, a heater mask D is used which has rectangular windows (the term "rectangular" also comprising the particular case of a square shape). Consequently, the openings 21 have a substantially rectangular shape. Then the heating layer, for example of TiSiN, TiAlN or TiSiC, with a thickness of 10–50 nm, preferably 20 nm, is deposited. The heating layer coats the walls and bottom of the openings 21 conformally. Consequently, in top plan view, the cup-like regions 22 here define an ideally rectangular shape, possibly with rounded edges (on account of the lithographic limits), or at the most an ovalized shape, with the longer side, or main direction, parallel to the X direction (FIG. 22). Next, the heating layer is removed outside the openings 21 to form the cup-shaped regions 22, which are then filled with the dielectric material 23.

Then (FIG. 18), a stop layer 48, for example of nitride deposited by PECVD (Plasma Enhanced Chemical Vapor Deposition) with a thickness of 20–40 nm, a mold layer 49, for example of USG deposited by PECVD or SACVD (Sub-Atmospheric Chemical Vapor Deposition) with a thickness of 50–70 nm, and an adhesion layer 50, for example of Ti or Si with a thickness of 20–40 nm, are deposited in sequence.

Figure 18:
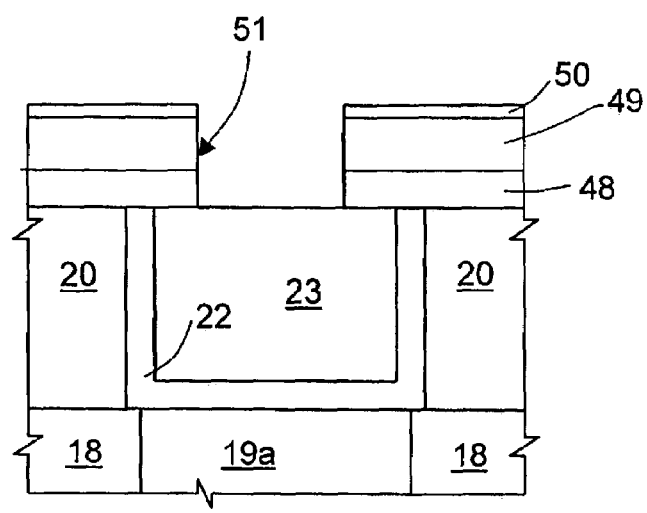
FIG. 18 is a cross-section similar to FIG. 8, in a manufacture step according to an embodiment of the invention.
Figure 19:
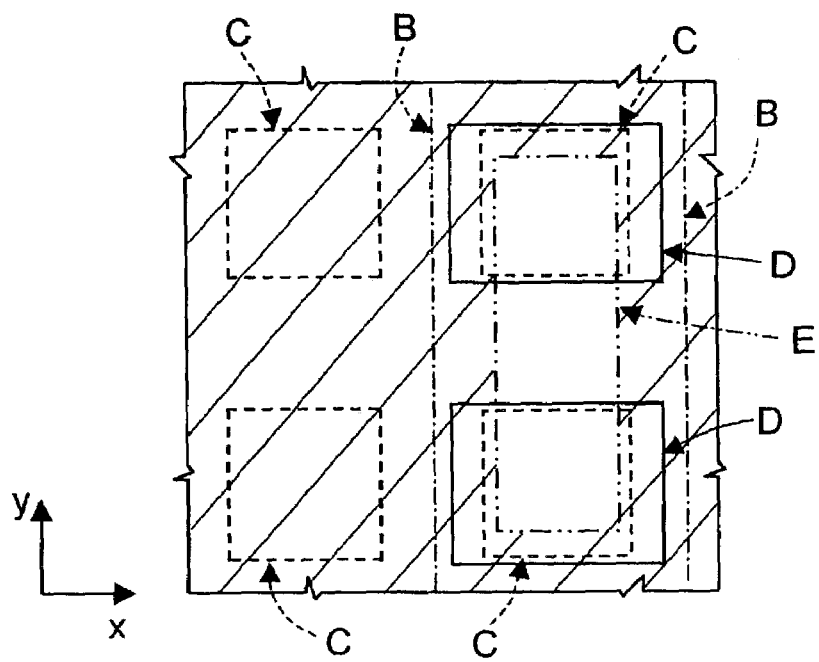
FIG. 19 shows the layout of some masks used for forming the structure of FIG. 18.

Next, using a minitrench mask, designated by E in FIG. 19, the adhesion layer 50, the mold layer 49 and the stop layer 48 are etched. As shown in FIG. 18, the minitrench mask E has a rectangular window that extends between two adjacent cells 5 in the Y direction (perpendicular to the alignment direction of the base and emitter regions 14, 15 of each memory cell 5, FIG. 7).

Following upon etching, part of the layers 48, 49 and 50 is removed, so as to form an opening 51 having a rectangular shape, corresponding to that of the minitrench mask E. The width of the opening 51 in the X direction is, for example, 160 nm. The opening 51 uncovers part of the dielectric material 23 of the two adjacent cells 5 and crosses each cup-shaped region 22 only once, as can be clearly seen from the superposition of the heater mask D and minitrench mask E in FIG. 19.

Figure 20:
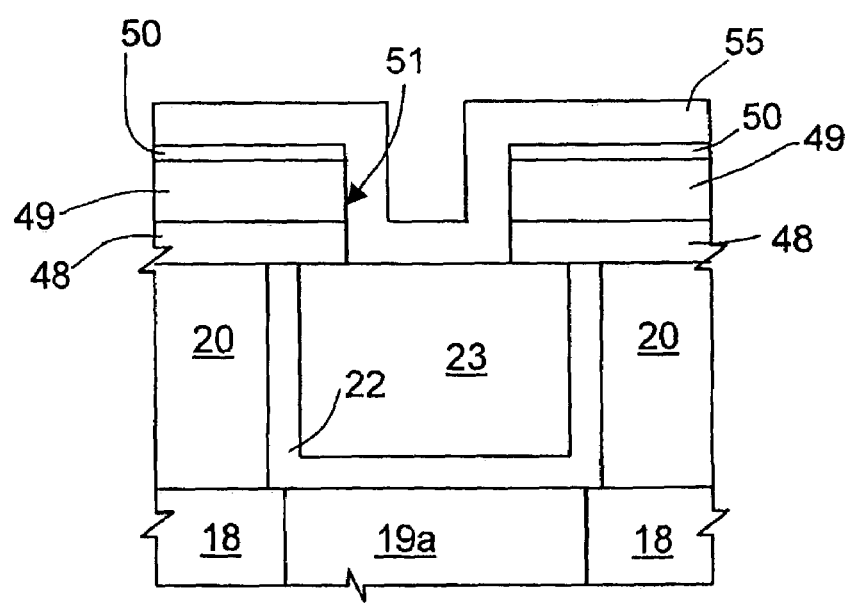
FIGS. 20 and 21 are cross-sections, similar to FIG. 18, in successive manufacture steps according to an embodiment of the invention.

Next, FIG. 20, a spacer layer 55, for example an oxide layer, is deposited (in particular, TEOS with a thickness of 50 nm) is deposited. The spacer layer 55 covers the adhesion layer 50, as well as the walls and bottom of the opening 51.

Figure 21:
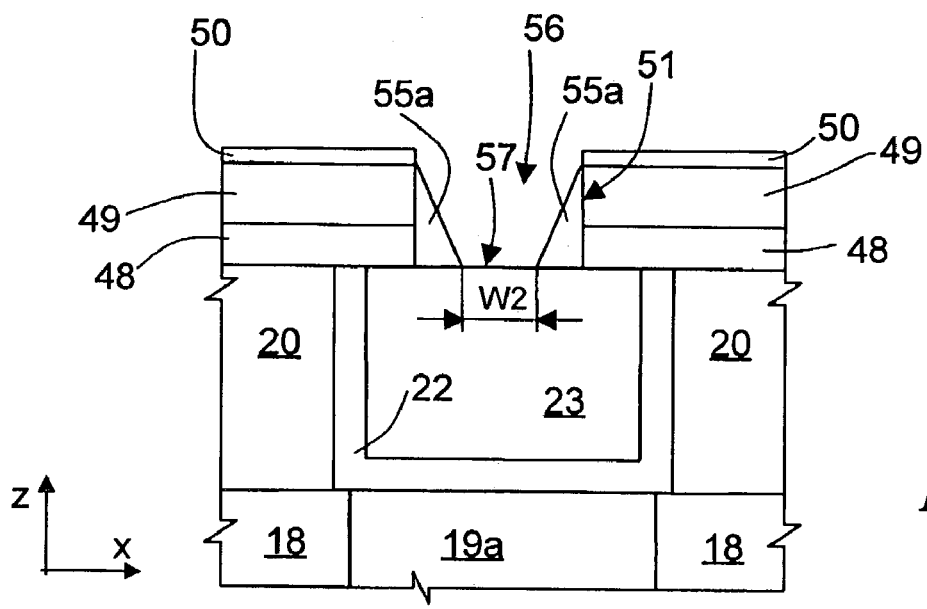

Then, FIG. 21, the spacer layer 55 is anisotropically etched by etching back until the horizontal portions thereof are removed, according to the Well known spacer formation technique. The spacer layer 55 is then completely removed above the adhesion layer 50 and is partially removed from the bottom of the opening 51 to form a spacer region 55a which extends along the vertical sides of the opening 51 (along the perimeter of a rectangle or of an oval) and delimits a slit 56, the base whereof forms a rectangular strip 57 having a sublithographic Width W2 (in the X direction) of approximately 60 nm. FIG. 22 is a top plan view of the structure thus obtained, and highlights how the strip 57 uncovers only one portion of the cup-shaped region 22 of each cell 5, shown with dashed line in the figure. The uncovered portion of each cup-shaped region 22 forms a contact area 58, as will be explained hereinafter.

Figure 23:
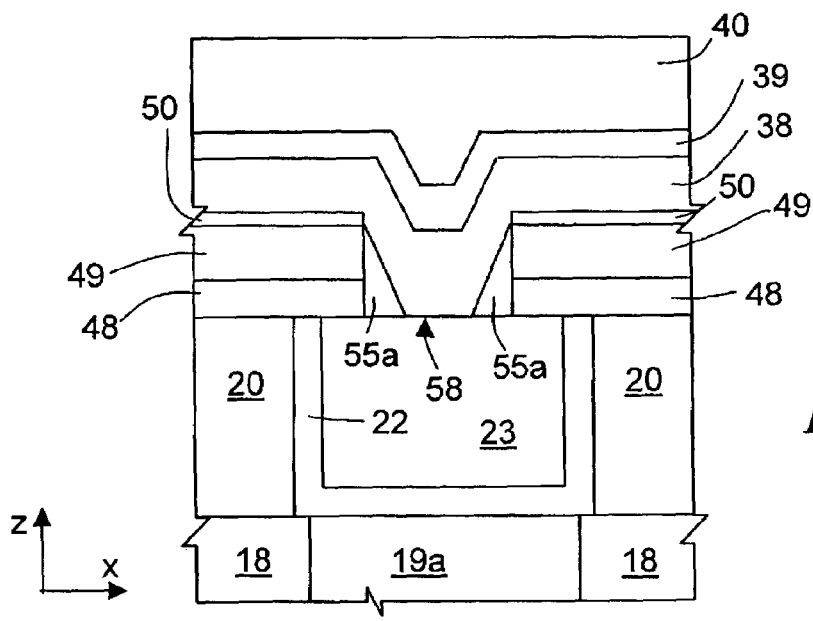
FIG. 23 is a cross-section, similar to FIG. 21, in a subsequent manufacture step.

Next, FIG. 23, the chalcogenic layer 38 (also in the present case, for instance, of $Ge_2Sb_2Te_5$ with a thickness of 60 nm), the barrier layer 39, and the metal layer 40 are deposited in succession, to form a stack of layers 41. The chalcogenic layer 38 is in direct contact with the adhesion layer 50, to which it adheres properly, and fills the slit 56 with a thin portion 38a. In particular, the thin portion 38a of the chalcogenic layer 38 deposits on the strip 57, contacting the cup-shaped regions 22 at the contact areas 58. The inclined wall formed by the spacer region 55a favors filling of the slit 56, so preventing problems linked to a poor aspect ratio of the opening 51.

Figure 24:
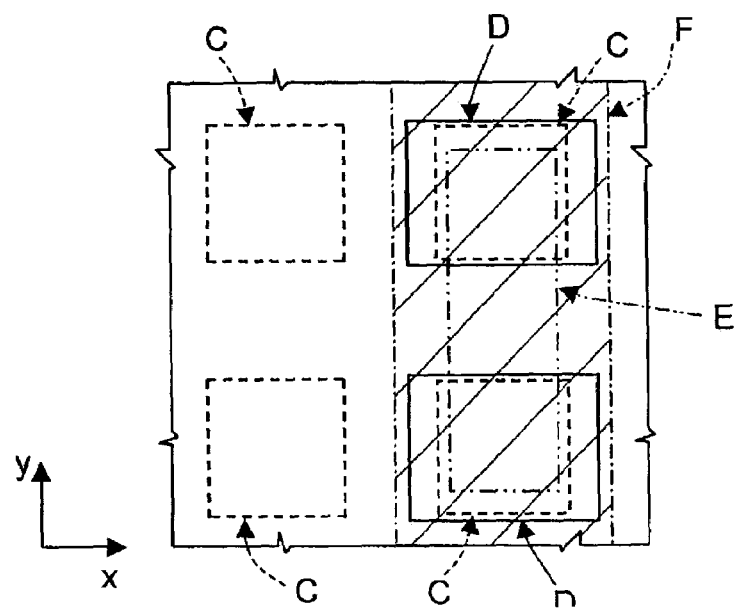
FIG. 24 shows the layout of same masks used for forming the structure of FIG. 23.

Next, the stack of layers 41 is defined using a stack mask F (FIG. 24).

The process continues with the steps described previously, which comprise deposition of the third dielectric layer 42, opening of the third dielectric layer 42 above the base contacts 19b, formation of the top contacts 43, and formation of connection lines for connection to the base contacts 19b and to the bit lines 41, so as to obtain the final structure shown in FIG. 25.

According to a different embodiment, the thin portion 38a of the chalcogenic layer 38 is formed using the technology described in the parent patent application, and the second crossing-over of the cup-shaped region 22 by the thin portion 38a is avoided by using a special mask, called self-rapier mask, as described hereinafter.

In detail, the process comprises the same initial steps described with reference to FIGS. 4–9, with the sole difference that the cup-shaped region 22 is shaped using the heater mask D illustrated in FIG. 17, so as to obtain a rectangular, or at the most oval, shape owing to the lithographic limits.

At this point in the fabrication process, the vertical wall 31a of the first delimitation layer 29 is present on the step 30, and the rest of the sacrificial layer has already been removed.

Figure 27:
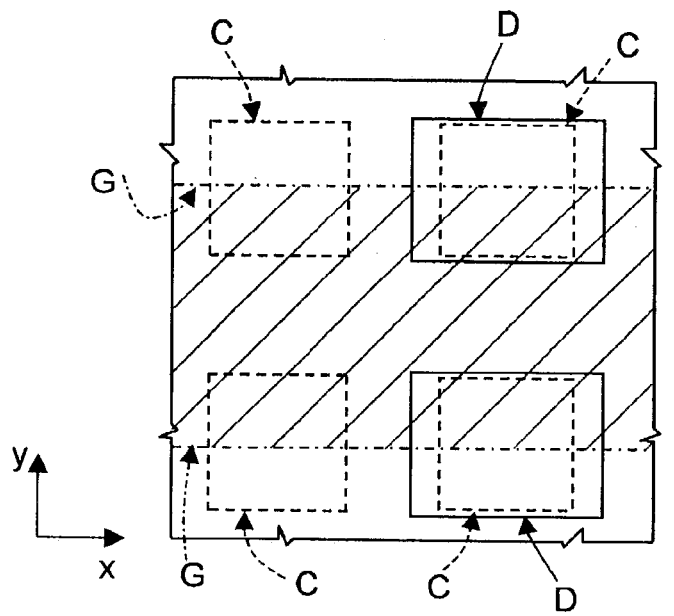
FIG. 27 shows the layout of some masks used after forming the structure of FIG. 10, according to a different embodiment of the invention.
Figure 28:
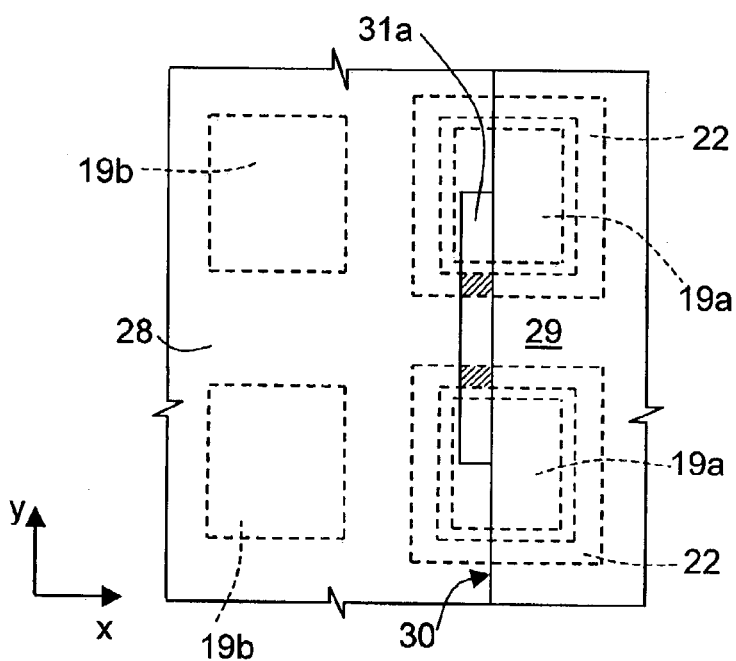
FIG. 28 shows the structure obtained using the masks of FIG. 27.

Next, using an appropriate mask, referred to as self-rapier mask G, illustrated in FIG. 27, part of the vertical wall 31a is removed so that the latter will intersect the cup-shaped region 22 of each cell 5 only in one point. In detail, the self-rapier mask G covers a strip that bestrides two cells 5 in a direction parallel to the X direction. The portions of the vertical wall 31a not covered by the self-rapier mask G are then removed. In this way, as shown in the top plan view of FIG. 28 of the two adjacent cells 5, just one portion of vertical wall 31a remains at the side of the step 30, the cross section whereof in the X-Z plane coincides with that of FIG. 10 described above. As may be noted, the remaining portion of vertical wall 31a intersects each cup-shaped region 22 just once, as is highlighted by the hatched area which, later, forms the contact area 45.

The process proceeds with the same steps described above with reference to FIGS. 11–14, and then with deposition of the second delimitation layer 35; thinning-out of the delimitation layers 35 and 29, as well as of the vertical wall 31 until the structure illustrated in FIG. 11 is obtained; removal of the sacrificial portion 36 and etching of the adhesion layers 28 and of the mold layer 27 (FIG. 12); deposition of the chalcogenic layer 38 which fills the slit 37 of the mold layer 27; deposition of the barrier layer 39 and of the metal layer 40; shaping of the stack formed by the metal layer 40, the barrier layer 39 and the chalcogenic layer 38; deposition of the third dielectric layer 42; and the final steps described above for obtaining the structure illustrated in FIG. 14.

In practice, in both of the embodiments, thin portions 38a are formed, that have a roughly parallelepipedal shape and short length, i.e., smaller than the overall dimensions of two cells 5 in the Y direction. In the first embodiment, the thin portion 38a is delimited by the spacer region 55a; in the second embodiment, the thin portion 38a is delimited directly by the mold layer 27.

The advantages of the process and structure described herein are illustrated hereinafter. First place, the rectangular or ovalized shape of the cup-shaped region 22 reduces the dimension spread of the contact area 58 also when its shape, instead of being rectangular, as in the ideal case, is oval, as highlighted by the comparison between FIG. 26a, showing the relative position of the cup-shaped region 22 and the thin region 38a in absence of mask misalignment, and FIG. 26b, which illustrates this position in presence of misalignment. In particular, as may be seen in the case of a cup-shaped region 22 having an ovalized shape, misalignments between the heater mask D and the minitrench mask E or the mask defining the first delimitation layer 29 lead to a negligible variation in the contact area. In the ideal case in which the cup-shaped region 22 has a rectangular shape, the variation in dimensions is even zero.

In the embodiment illustrated in FIGS. 17–25, the sequence of steps required for forming the thin portion 38a is simplified, and the chalcogenic layer 38 adheres perfectly to the underlying layers and fills the opening 51 correctly, thanks to the inclination of the spacer region 55a, as already mentioned previously.

Furthermore, the shape of the minitrench mask E or the use of the self-rapier mask G makes it possible to obtain a single contact area 58 for each cup-shaped region 22, and thus for each cell 5.

Finally, it is clear that numerous modifications and variations may be made to the process and to the memory cell described and illustrated herein, all falling within the scope of the invention, as defined in the attached claims. In particular, although the invention has been illustrated with particular reference to a phase change memory cell, it is applicable to any sublithographic contact area between two regions each having just one sublithographic dimension, affected by the same problem of dimension variability, for example on account of the misalignment of the corresponding masks.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A phase change memory cell comprising:
 a cup-shaped resistive element comprising vertical walls forming a first portion in a first direction, the first thin portion having a dimension less than 100 nm; and
 a memory region of a phase change material including a second thin portion having a second dimension in a second direction transverse to said first dimension, the second dimension being less than 100 nm;

said resistive element and said memory region being in direct electrical contact at said first thin portion and said second thin portion and defining a contact area having an extension less than 100 nm, wherein said resistive element extends, in top plan view, along a closed line having an elongated shape in said first direction.

2. The memory cell according to claim 1, wherein said elongated shape is chosen between rectangular and elongated oval.

3. The memory cell according to claim 1, wherein said memory region crosses, and is in direct electrical contact with, said resistive element only at said first thin portion so as to form a single contact area.

4. The memory cell according to claim 1, wherein said second thin portion is laterally delimited, at least in said second direction, by spacer portions of a first dielectric material defining surfaces that are inclined in a third direction transverse to said first and second directions.

5. The memory cell according to claim 4, wherein said spacer portions are surrounded by a mold layer of a second dielectric material forming a lithographic opening.

6. The memory cell according to claim 1, wherein said second thin portion is surrounded by a mold layer of a second dielectric material forming an opening having an approximately rectangular shape.

7. The memory cell according to claim 6, wherein said second thin portion is in direct contact with said mold layer and said opening is of a dimension less than 100 nm.

8. The memory cell according to claim 1, wherein said second thin portion has a substantially elongated shape with a principal dimension extending parallel to said first direction.

9. A process for manufacturing a phase change memory cell, comprising:

forming a cup-shaped resistive element comprising vertical walls forming a first thin portion having a first dimension in a first direction, the first dimension being less than 100 nm; and forming a memory region of a phase change material in direct electrical contact with said first thin portion including a second thin portion and having a second dimension in a second direction transverse to said first dimension, the second dimension being less than 100 nm;

said first and second thin portions defining a contact area having an extension less than 100 nm;

wherein said resistive element extends, in top plan view, along a closed line having an elongated shape in said first direction.

10. The process according to claim 9, wherein said elongated shape is chosen between rectangular and elongated oval.

11. The process according to claim 9, wherein said step of forming a resistive element comprises forming a first lithographic opening in an insulating layer, depositing a conductive layer on a side wall of said second lithographic opening, and filling said second lithographic opening.

12. The process according to claim 9, wherein said step of forming a memory region comprises forming a mold structure on top of said resistive element, said mold structure having a slit crossing said first thin portion only in one point, said slit having said second dimension;

depositing a phase change layer at least inside said slit and forming said second thin portion.

13. The process according to claim 12, wherein said step of forming a mold structure comprises depositing a mold layer; forming a second lithographic opening in said mold layer; and forming spacer portions in said second lithographic opening, said spacer portions delimiting said slit.

14. The process according to claim 13, wherein said step of forming spacer portions comprises, after said step of forming a second lithographic opening, depositing a spacer layer and anisotropically etching said spacer layer.

15. The process according to claim 12, wherein said resistive layer is formed in an insulating layer and said step of forming a mold structure comprises depositing a first delimitation layer on top of said insulating layer, said first delimitation layer forming a step having a vertical wall extending transversely to said first thin portion; forming a sacrificial portion along said vertical wall; removing part of said sacrificial portion to form a sacrificial region that crosses said resistive element in just one point; forming a second delimitation area extending above said insulating layer and at the sides of said sacrificial region as well as of said first delimitation layer; and removing said sacrificial region to form a delimitation opening.

16. The process according to claim 15, wherein, before forming a first delimitation layer, a step is carried out of depositing a mold layer on top of said insulating layer; and in which, after said step of removing said sacrificial region, steps are carried out of forming said slit in said mold layer underneath said delimitation opening and removing said first delimitation layer and said second delimitation layer.

* * * * *

UNITED STATES PATENT AND TRADEMARK OFFICE
CERTIFICATE OF CORRECTION

PATENT NO. : 6,972,430 B2
APPLICATION NO. : 10/371154
DATED : December 6, 2005
INVENTOR(S) : Giulio Casagrande et al.

Page 1 of 1

It is certified that error appears in the above-identified patent and that said Letters Patent is hereby corrected as shown below:

Column 2
Line 42, "...first direction." should read as --... second direction.--.
Line 54, "...an elongated shape in the first direction." should read as --...an elongated shape in the second direction.--.

Column 8
Line 64, "...forming a first portion in a first direction,..." should read as --forming a first thin portion in a first direction,...--.

Column 9
Line 9, "...first direction." should read as --...second direction.--.
Line 34, "...extending parallel to said first direction." should read as --... extending parallel to said second direction.--.

Column 10
Line 3, "...first direction." should read as --...second direction.--.

Signed and Sealed this

Thirteenth Day of November, 2007

JON W. DUDAS
*Director of the United States Patent and Trademark Office*